United States Patent
Nitta

Patent Number: 5,900,650
Date of Patent: May 4, 1999

[54] SEMICONDUCTOR DEVICE AND METHOD OF MANUFACTURING THE SAME

[75] Inventor: Koichi Nitta, Kanagawa-ken, Japan

[73] Assignee: Kabushiki Kaisha Toshiba, Kawasaki, Japan

[21] Appl. No.: 08/887,258

[22] Filed: Jul. 2, 1997

Related U.S. Application Data

[63] Continuation of application No. 08/697,283, Aug. 27, 1996, abandoned.

[30] Foreign Application Priority Data

Aug. 31, 1995 [JP] Japan ................................ 7-223989

[51] Int. Cl.$^6$ ................................................. H01L 33/00
[52] U.S. Cl. ........................... 257/94; 257/13; 257/96; 257/103; 257/507; 438/465
[58] Field of Search ................................. 257/13, 90, 94, 257/96, 102, 103, 458, 919, 507; 438/465, 959

[56] References Cited

U.S. PATENT DOCUMENTS

| | | | |
|---|---|---|---|
| 3,864,162 | 2/1975 | Kenty | 117/213 |
| 4,352,016 | 9/1982 | Duffy et al. | 250/358.1 |
| 4,791,465 | 12/1988 | Sakai et al. | 357/25 |
| 5,247,533 | 9/1993 | Okazaki et al. | 257/13 |
| 5,479,827 | 1/1996 | Kimura et al. | 73/718 |
| 5,549,978 | 8/1996 | Iwasaki et al. | 428/692 |
| 5,563,422 | 10/1996 | Nakamura et al. | 257/103 |
| 5,602,418 | 2/1997 | Imai et al. | 257/627 |

FOREIGN PATENT DOCUMENTS

| | | | |
|---|---|---|---|
| 4-321280 | 11/1992 | Japan . | |
| 406021511 | 1/1994 | Japan | 257/96 |
| 406053549 | 2/1994 | Japan | 257/96 |

*Primary Examiner*—Valencia Martin-Wallace
*Assistant Examiner*—George C. Eckert, II
*Attorney, Agent, or Firm*—Finnegan, Henderson, Farabow, Garrett & Dunner, L.L.P.

[57] ABSTRACT

There is disclosed a semiconductor device formed on a sapphire substrate, for example, a blue LED of a double-hetero structure having a laminated structure which comprises a first cladding layer made of a first conductivity type gallium nitride based semiconductor, an active layer made of a gallium nitride based semiconductor into which impurity is not doped intentionally, and a second cladding layer made of a second conductivity type gallium nitride based semiconductor which being opposite to the first conductivity type on a sapphire substrate. A surface of the sapphire substrate is polished to have optical transmissivity of more than 60%.

20 Claims, 5 Drawing Sheets

TRANSMISSIVITY OF SAPPHIRE SUBSTRATE (%)

SEMICONDUCTOR DEVICE AND METHOD OF MANUFACTURING THE SAME

This application is a continuation of application Ser. No. 08/697,283, filed Aug. 27, 1996, now abandoned.

BACKGROUND OF THE INVENTION

1. Field of the Invention

The present invention relates to a semiconductor device using a sapphire substrate and a method of manufacturing the same and, more particularly, a semiconductor device such as a light emitting diode or an integrated circuit using a sapphire substrate and a method of manufacturing the same.

2. Description of the Prior Art

In recent years, a gallium nitride (GaN)-based III-V compound semiconductor such as GaN, $In_xGa_{1-x}N$, or $Ga_xAl_{1-x}N$ attracts attention as material for a blue light-emitting diode (LED) or a blue semiconductor laser diode (LD). With the use of this compound semiconductor, it has been possible to achieve the blue-emitting device having luminous intensity to some extent. The blue-emitting devices employing the GaN-based compound semiconductor have used the sapphire ($Al_2O_3$) substrate as a substrate. Several proposals have been set forth in Patent Application Publication (KOKAI) 4-321280 and others. A basic structure of the conventional LED is shown in FIG. 1. More particularly, a blue light-emitting device 2 consists of an n-type GaN semiconductor layer 202 and a p-type GaN semiconductor layer 203, both being laminated on a sapphire substrate 100 via a buffer layer 201. A blue light can be emitted by injecting carriers into a pn-junction region formed between the n-type GaN semiconductor layer 202 and the p-type GaN semiconductor layer 203.

In order to manufacture such blue light-emitting device, first the preselected sapphire substrate 100 is prepared, then respective gallium nitride semiconductor layers 201, 202, 203 are laminated on the sapphire substrate 100 by metalorganic chemical vapor deposition (MO-CVD) method and the like, then the laminated substrate is taken out from a reaction chamber of the CVD apparatus, then the resultant laminated substrate is cut out to be separated into individual chips of an appropriate size, and finally these chips are then connected to wire frames and are subjected to necessary wirings, molding, etc. Thus the blue light-emitting device has been finished as the product.

In the meanwhile, remarkable progress in high integration density has been achieved in recent semiconductor integrated circuit technology, especially dynamic random access memory (DRAM) technology which begins to enter into a gigabit integration. However, with the progress in integration degree, a memory cell-area of the DRAM is prone to be reduced more and more. Therefore, it is difficult to assure memory cell capacity for compensating for disappear of memory contents caused by alpha ($\alpha$)-particles which exist in the natural world, i.e., so-called soft error. Hence, as shown in FIG. 2, a semiconductor device is often fabricated on a single crystal silicon film formed on the sapphire substrate because it is feasible to match lattice constant of silicon crystal with lattice constant of the sapphire. Since a so-called SOS (Silicon-On-Sapphire) device shown in FIG. 2 can be miniaturized and operate at high speed, it would be promising as a high performance device. Because of its structure, the SOS device must be formed to use the single crystal Si layer formed on the sapphire substrate as the active region. Therefore, such several advantageous merits will be expected that devices like transistors formed in the active region may be perfectly isolated, stray capacitance between the substrate and the circuit can be lessened if the integrated circuit, etc. are formed thereon, latch-up can be suppressed in CMOS, and the like. In addition, since the SOS device may restrict electron-hole pairs generated by $\alpha$-particles within a thin single crystal silicon film which is formed on the sapphire substrate, $\alpha$-particle immunity or the soft-error-rate reduction in DRAM, and so on can be improved remarkably. FIG. 2 is a sectional view showing the DRAM cell having the SOS structure. A silicon film 303 is epitaxially grown on a sapphire substrate 100. An $n^+$ type source region 306 and $n^+$ type drain region 316 are then formed in the silicon film 303. A data line (bit line) 409 is then formed on the $n^+$ type drain region 316 via a contact electrode 408. A storage electrode 405, a capacitor insulating film 406, and an opposing electrode (plate electrode) 407 are formed on the $n^+$ type source region 306 via a contact electrode 410. A gate electrode 305 made of polysilicon, etc. is formed on a channel region between the $n^+$ type source region 306 and the $n^+$ type drain region 316 and on the silicon film 303 via a gate oxide film 304. The gate electrode 305 also serves as a word line of the DRAM.

In the conventional semiconductor device such as LED or DRAM using the sapphire substrate as described above, it is considerably hard, due to hardness of the sapphire substrate, to cut off the sapphire substrate on which semiconductor layers are laminated. Usually the sapphire substrate is cut off by the diamond cutter. Nevertheless, the sapphire substrate must be polished very thin in advance of cutting, up to less than 250 $\mu$m (even though it may be thick), for example, or up to about 100 $\mu$m as the case may be. But such problems have arisen that it is very difficult in respects of mechanical strength, etc. to polish the sapphire substrate up to such thin thickness and, therefore, not only is it probable that the growth layers acting as the light-emitting layer and the channel region are distorted or strained with such polishing, but also considerable manufacturing time is required. Accordingly, the cost of production has gone up, which is one of bars to mass production of the semiconductor device formed on a sapphire substrate.

SUMMARY OF THE INVENTION

In light of the above problems, an object of the present invention is to provide a semiconductor device using a sapphire substrate which is easily manufactured and a method of manufacturing the same.

Another object of the present invention is to provide a light-emitting device like LED and an integrated circuit such as a SOS-DRAM with high manufacturing yield and a method of manufacturing the same.

Still another object of the present invention is to provide a semiconductor device such as a light-emitting device and an integrated circuit which is fitted for mass production and a method of manufacturing the same.

In order to attain the above objects, the present invention is characterized by a semiconductor device such as LED, semiconductor laser, photodetector, DRAM, etc. formed on a sapphire substrate, in which surface roughness of the sapphire substrate 100 is finished to have a predetermined flatness, i.e., flatness which corresponds to unevenness of less than 30 nm in measurement by a Probe method or stylus method.

More particularly, a semiconductor device of the present invention comprises at least first conductivity type semiconductor single crystal layers 101, 102, 103, and 104 formed on a sapphire substrate 100, and second conductivity type semiconductor regions 105, and 106 formed on these semiconductor single crystal layers as shown in FIG. 3, otherwise a second conductivity type semiconductor region 306 formed in semiconductor single crystal layers 303 as shown in FIG. 7, wherein surface roughness of the sapphire substrate 100 is finished to have the above flatness.

While taking a blue light-emitting diode (LED) shown in FIG. 3 as an example, the present invention will be explained in more detail as follows. That is, the blue LED as an example of the present invention of a double-hetero structure (DH structure) having a laminated structure, which comprises a first cladding layer made of a first conductivity type gallium nitride (GaN)-based semiconductor, an active layer made of a substantially intrinsic GaN-based semiconductor, and a second cladding layer made of a second conductivity type GaN-based semiconductor which has opposite conductivity to the first conductivity type on a sapphire substrate. Surface roughness of the sapphire substrate is less than 30 nm in measurement by a Probe method. For example, the first conductivity type signifies n-type conductivity while the second conductivity type signifies p-type conductivity which is opposite to the n-type conductivity, but it is of course that the n-type conductivity and the p-type conductivity may be used in a reversed manner.

While also taking the LED as an example, a method of manufacturing a semiconductor device according to the present invention will be explained as follows. That is, the present invention is characterized by comprising the steps of laminating sequentially in order, on a sapphire substrate, a buffer layer made of a first conductivity type GaN-based semiconductor, a first cladding layer made of a first conductivity type GaN-based semiconductor, an active layer made of substantially intrinsic GaN-based semiconductor, and a second cladding layer made of a second conductivity type GaN-based semiconductor which having opposite conductivity to the first conductivity type, and polishing the sapphire substrate up to a predetermined thickness to have a smooth surface. In other words, the sapphire substrate is polished to have transmissivity of more than 60%, and thereafter cut off into a plurality of chips. This polishing may be continued up to a thickness of about 260 $\mu$m to 400 $\mu$m, and there is no need for excessive thin thickness of the substrate.

With the above structure, in the semiconductor device according to the present invention, the sapphire substrate may be readily cut off into a plurality of chips even though it has a large thickness. For this reason, polishing of the sapphire substrate may be considerably simplified.

Accordingly, manufacturing yield of the semiconductor device can be extremely improved as the product.

Other and further objects and features of the present invention will be become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
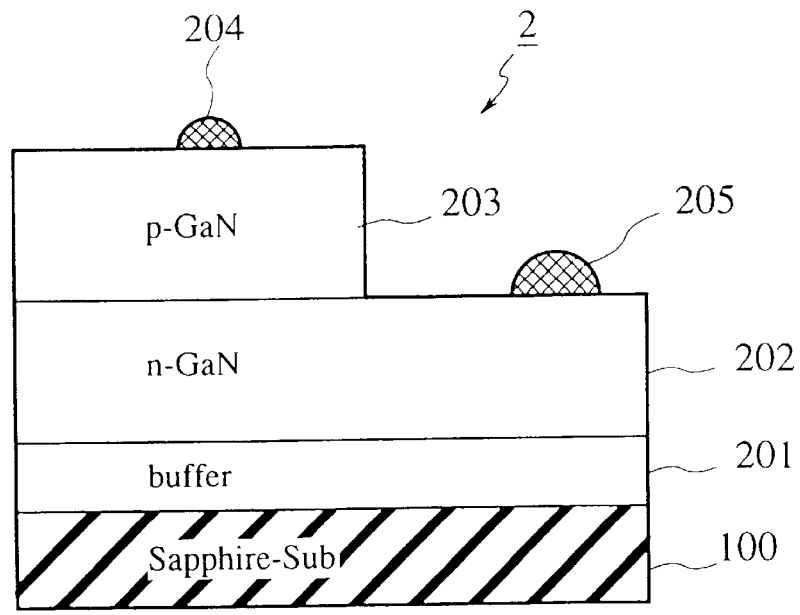
FIG. 1 is a schematic sectional view showing a layer structure of a semiconductor chip of a gallium nitride (GaN)-based compound semiconductor blue light-emitting diode (LED) in the prior art.
Figure 2:
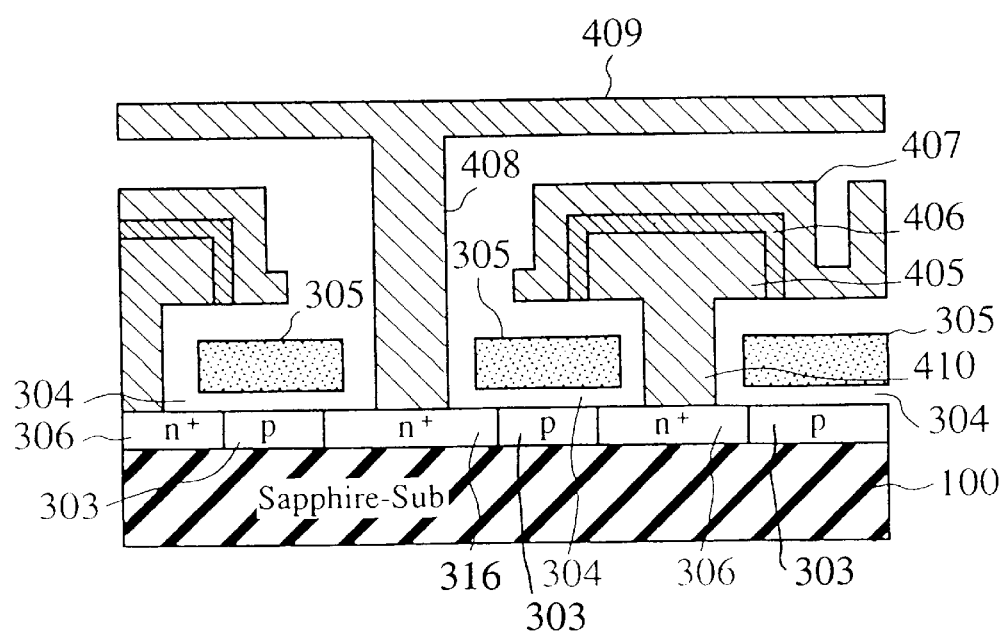
FIG. 2 is a sectional view showing a structure of a DRAM having a conventional SOS structure.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thickness are arbitrarily drawn for facilitating the reading of the drawings.

Figure 3:
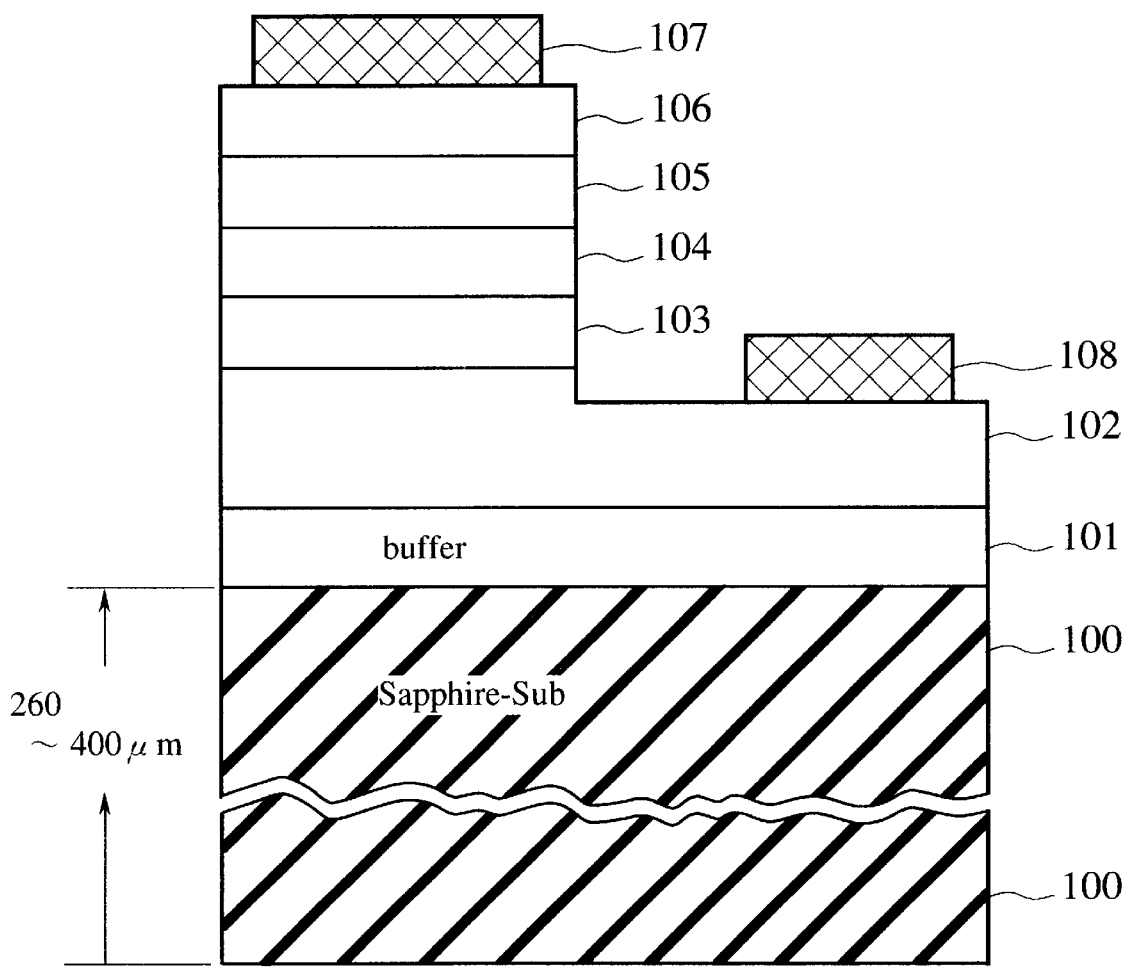
FIG. 3 is a sectional view showing a layer structure of a semiconductor chip of a GaN-based compound semiconductor blue LED according to the present invention.

A gallium nitride (GaN)-based compound semiconductor blue-light emitting diode (LED) according to the present invention will be explained with reference to FIG. 3. The GaN-based compound semiconductor blue LED 1 according to the present invention will be manufactured as follows. On a (0001) sapphire substrate 100 are formed in sequence a buffer layer 101 made of a GaN-based semiconductor, an n-type contact layer 102 made of an n-type GaN-based semiconductor, a first cladding layer 103 made of an n-type GaN-based semiconductor, an active layer 104 made of an undoped GaN-based semiconductor, a second cladding layer 105 made of a p-type GaN-based semiconductor, a p-type contact layer 106 made of a p-type GaN-based semiconductor, an n side electrode 108 connected to the n-type contact layer 102, and a p side electrode 107 connected to the p-type second cladding layer 105. The n side electrode 108 is formed on the bottom of the trench which is formed by etching the p-type contact layer 106, the second cladding layer (p-type cladding layer) 105, the active layer 104, and the first cladding layer (n-type cladding layer) 103 so as to expose the n-type contact layer 102.

In the present invention, an $In_xAl_yGa_{1-x-y}N$ compound semiconductor is used as the GaN-based semiconductors. This is because the green, blue-green, blue and UV emission can be implemented in a wide range by adjusting mole fraction values x, y. Particular examples of mole fraction values are given in the following. Where mole fraction values x, y satisfy $0 \leq x \leq 1$, $0 \leq y \leq 1$ and $x+y \leq 1$. The buffer layer 101 made of the GaN-based semiconductor is provided to relax lattice mismatching between the n-type contact layer 102 made of the n-type GaN-based semiconductor and the sapphire substrate 100. For example, respective mole fraction values of $In_xAl_yGa_{1-x-y}N$ are selected to be $0 \leq x \leq 1$, $0 \leq y \leq 1$, preferably $0 \leq x \leq 0.5$, $0 \leq y \leq 0.5$. The n-type contact layer 102 is provided to make good ohmic contact with the n side electrode 108. In the case of the n-type contact layer 102, the mole fraction values of $In_xAl_yGa_{1-x-y}N$ are selected respectively to be $0 \leq x \leq 1$, $0 \leq y \leq 1$, preferably $0 \leq x \leq 0.3$, $0 \leq y \leq 0.3$, for instance. In order to obtain n-type conductivity, an impurity such as silicon (Si) or selenium (Se) is doped. Impurity concentration is of $6 \times 10^{18}$ cm$^{-3}$. The first cladding layer 103 serving as the n-type cladding layer constitutes an n side of pin junction serving as a light emitting region. Although respective mole fraction values of $In_xAl_yGa_{1-x-y}N$ used as the first cladding layer 103 may be adjusted appropriately in response to luminous wavelength to be generated, they are selected to be $0 \leq x \leq 1$, $0 \leq y \leq 1$, preferably $0 \leq x \leq 0.3$, $0.1 \leq y \leq 1$, for example. In order to obtain n-type conductivity, an impurity such as Si or Se is also doped. Impurity concentration is set to $3 \times 10^{18}$ cm$^{-3}$.

The active layer 104 made of the GaN-based semiconductor constitutes a central region of the light emitting region, which is substantially intrinsic semiconductor layer. The mole fraction values of $In_xAl_yGa_{1-x-y}N$ used as the active layer 104 may be adjusted appropriately correspondingly to luminous wavelength to be generated, and therefore they are selected respectively to be $0 \leq x \leq 1$, $0 \leq y \leq 1$, preferably $0 \leq x \leq 0.5$, $0 \leq y \leq 0.6$, for example. The second cladding layer (p-type cladding layer) 105 made of the GaN-based semiconductor constitutes a p side of the pin junction serving as the light emitting region. In conjunction with the n-type GaN-based semiconductor cladding layer 103 and the GaN-based semiconductor active layer 104, respective mole fraction values of $In_xAl_yGa_{1-x-y}N$ used in the p-type cladding layer 105 may be adjusted suitably in compliance with luminous wavelength to be generated. For example, the mole fraction values are selected to be $0 \leq x \leq 1$, $0 \leq y \leq 1$, preferably $0 \leq x \leq 0.3$, $0.1 \leq y \leq 1.0$. In order to achieve p-type conductivity, an impurity such as magnesium (Mg), beryllium (Be) or zinc (Zn) is doped. Impurity concentration is of $3 \times 10^{18}$ cm$^{-3}$. The p-type contact layer 106 made of the p-type GaN-based semiconductor provides a contact surface to a p side electrode 107. For instance, the mole fraction values of $In_xAl_yGa_{1-x-y}N$ used in the p-type contact layer 106 are selected respectively to be $0 \leq x \leq 1$, $0 \leq y \leq 1$, preferably $0 \leq x \leq 0.3$, $0 \leq y \leq 0.3$. In order to have p-type conductivity, an impurity such as Mg, Be or Zn is also doped. Impurity concentration is set to $6 \times 10^{18}$ cm$^{-3}$.

The p side electrode 107 is an electrode which is transparent to a light emitted from the GaN-based semiconductor active layer 104. More particular, this electrode is formed of a compound of metal and oxygen like ITO (indium tin oxide), but it may be formed of a sufficiently thin metal such as Al or Ni. The n side electrode 108 is another electrode which is not always transparent to the light. For instance, this electrode may be formed of metal such as Ti, Al, or Ni.

In the foregoing explanation, the mole fraction values of $In_xAl_yGa_{1-x-y}N$ are determined respectively such that bandgaps of the n-type GaN-based semiconductor cladding layer 103 and the p-type GaN-based semiconductor cladding layer 105 become large rather than that of the GaN-based semiconductor active layer 104. With the above structure, an amount of carriers which are to be injected into the GaN-based semiconductor active layer 104 may be increased, and therefore luminance intensity may be further improved.

Next, a method of manufacturing the blue LED having the structure shown in FIG. 3 will be explained with reference to FIGS. 4A to 4D and FIG. 5 hereinbelow.

Figure 4A:
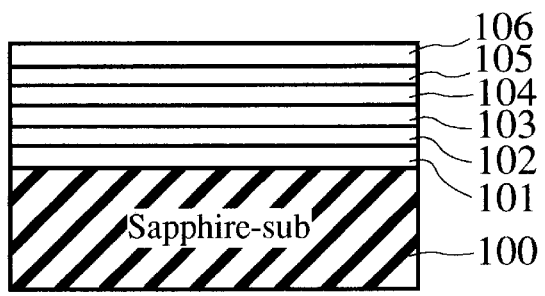
FIGS. 4A to 4D are sectional views illustrating manufacturing steps of the GaN-based compound semiconductor blue LED according to the present invention.

(a) As shown in FIG. 4A, on the (0001) sapphire substrate 100 having a predetermined thickness are laminated by MO-CVD, halide CVD, molecular-beam epitaxy (MBE), etc. in sequence the n-type $In_xAl_yGa_{1-x-y}N$ buffer layer 101, the n-type $In_xAl_yGa_{1-x-y}N$ contact layer 102, the n-type $In_xAl_yGa_{1-x-y}N$ cladding layer 103, the non-doped $In_xAl_yGa_{1-x-y}N$ active layer 104, the p-type $In_xAl_yGa_{1-x-y}N$ cladding layer 105, and the p-type $In_xAl_yGa_{1-x-y}N$ contact layer 106. In the case of growth by atmospheric pressure (AP) MO-CVD, trimethylgallium (Ga(CH$_3$)$_3$), trimethylindium (In(CH$_3$)$_3$), trimethylaluminum (Al(CH$_3$)$_3$), ammonia (NH$_3$), and the like may be used as the reaction gas, for example. These material gases are introduced into the CVD-growth chamber together with the carrier gas such as hydrogen or nitrogen. In this manner, GaN-based semiconductors are grown continuously from the buffer layer 101 to the contact layer 106. At that time, component ratios of respective layers can be controlled by changing respective component rates in the reaction gas. Further, monosilane (SiH$_4$), biscyclopentadienylmagnesium (Cp$_2$Mg), and so forth are introduced appropriately in order to dope impurity into the semiconductor layers.

(b) Next, the sapphire substrate 100 on which the buffer layer 101 to the contact layer 106 are laminated in sequence is taken out from the CVD furnace. Then, an oxide film (SiO$_2$ film) is formed on the p-type $In_xAl_yGa_{1-x-y}N$ contact layer 106 by sputtering method, CVD method, or the like. The photoresist formed on the oxide film is patterned by means of predetermined photolithography technique to etch the oxide film selectively.

Figure 4B:
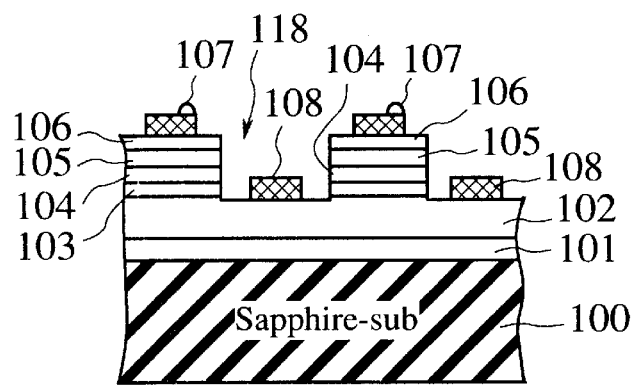

(c) With the use of the etching mask comprising the photoresist and the SiO$_2$ film, the p-type contact layer 106, the p-type cladding layer 105, the non-doped active layer 104, and the n-type cladding layer 103 are etched to form the U-shaped trench 118 shown in FIG. 4B and to expose the n-type contact layer 102 at the bottom of the U-shaped trench 118. A part of the n-type contact layer 102 may be etched further more.

(d) The etching mask material (photoresist/SiO$_2$ film) is removed, and the substrate is then cleaned. As shown in FIG. 4B, the p side electrode 107 of an ITO film is then formed by so-called "lift-off method". The ITO film may be deposited by CVD method, sputtering method, or the like.

(e) Subsequently, the substrate is cleaned. Metal material 108 such as Ti, Al, or Ni for the n side electrode 108 is then deposited on the entirety of the semiconductor layer by sputtering method or vacuum evaporation method. As shown in FIG. 4B, the n side electrode 108 is patterned on the bottom of the U-shaped trench 118 by virtue of photolithography method or lift-off method. It is of course that, if the lift-off method is used, photoresist patterns must be formed prior to deposition of the thin metal film.

Figure 4C:
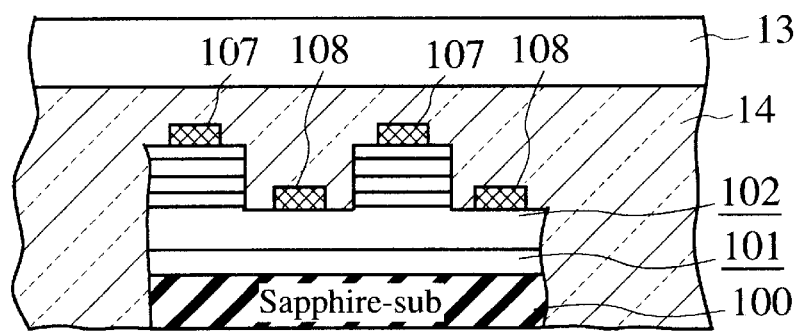
Figure 4D:
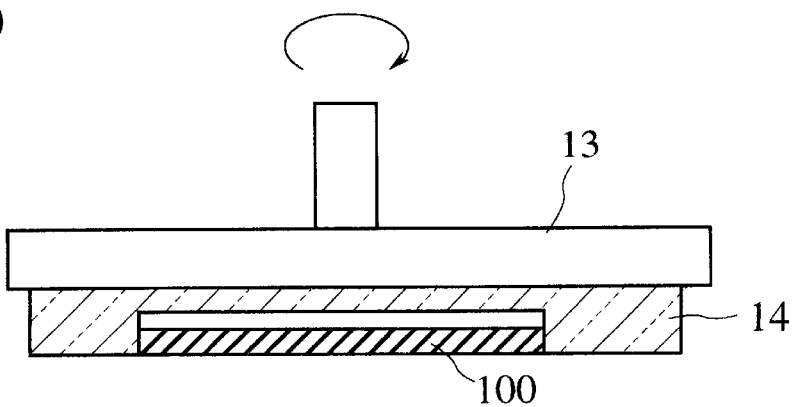

(f) Next, as shown in FIGS. 4C and 4D, the sapphire substrate 100 is secured to a predetermined polishing jig 13 by a wax 14. The wax 14 covers the entire surface of the resultant laminated structure made of the layers 101 to 106 to protect their surfaces. The surface of the sapphire substrate 100 is polished to achieve a predetermined surface smoothness. Polishing of the sapphire substrate will be explained in detail later.

(g) In this manner, after a basic structure of the blue LED is completed, the resultant LED is cut off by a diamond cutter (diamond blade) into a large number of chips of appropriate size. These chips are then mounted on predetermined stems respectively to be wire-bonded, and then molded. In the end, the blue emitting LED of the present invention has been finished.

Polishing of the sapphire substrate 100 will be explained hereinbelow. In the present invention, the polishing of the sapphire substrate 100 is finished when its thickness reaches 260 μm or more, e.g., when it falls within the range from 280

μm to 400 μm. It has been well known for the skilled person in the prior art that, in this situation, the sapphire substrate 100 cannot be successfully cut off even by the diamond cutter as it is. On the contrary, the inventor of the present invention has found by trial and error the fact that even such thick sapphire substrate 100 can be easily cut off if predetermined surface treatment is conducted beforehand according to the present invention. In other words, cutting-off of such thick sapphire substrate becomes easy if the surface of the sapphire substrate is rendered optically very smooth previously.

Figure 5:
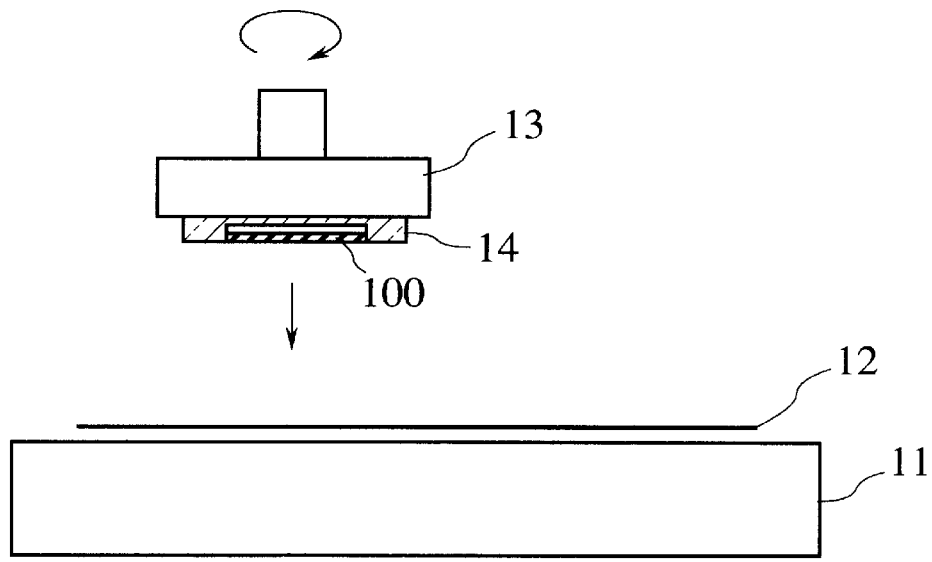
FIG. 5 is a view showing a method of polishing a sapphire substrate in the GaN-based compound semiconductor blue LED according to the present invention.

The process will be explained in detail with reference to FIGS. 4C and 4D and FIG. 5. At first, as shown in FIG. 5, a cloth 12 is laid on a glass substrate 11, then water is then poured over the cloth 12, and then abrasive is spread over the cloth 12. A particle size of the abrasive is about from #2000 to #4000. Meanwhile, as shown in FIGS. 4C and 4D, the sapphire substrate 100 is secured to a rotatable holder 13 to direct the surface on which the laminated structure of the GaN-based semiconductors is laminated to the upward direction. Then, while being rotated, the sapphire substrate 100 which has been secured to the holder 13 is polished by pushing the lower surface of the sapphire substrate 100 to the abrasive.

Figure 6:
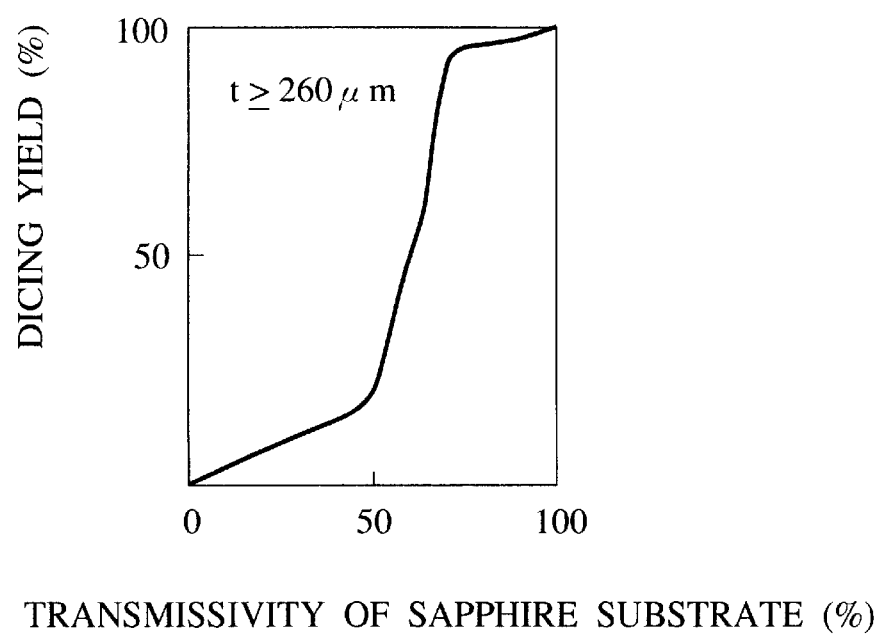
FIG. 6 is a view showing a relationship between dicing yield and transmissivity of a sapphire substrate in the GaN-based compound semiconductor blue LED according to the present invention.

Such polishing would be continued until the predetermined surface roughness of the sapphire substrate 100 can be implemented which corresponds to unevenness of less than 30 nm, preferably less than 10 nm, in measurement by a Probe method. In practice, the surface smoothness can be determined by measuring the transmissivity of the sapphire substrate 100 without the Probe method. In other words, since the inventor of the present invention has found the fact that a certain relationship is present between the surface smoothness and the transmissivity of light, the surface smoothness can be deduced according to this fact. More particularly, in the event that the transmissivity is below less than 60%, the surface roughness is excessively large so that cutting-off of the chips cannot be succeedingly effected. For this reason, dicing yield is lowered. Therefore, it can be understood that the sapphire substrate 100 would be polished to have the transmissivity of more than 60%. A relationship between the transmissivity of the substrate and dicing yield of the chip is shown in FIG. 6. In the present invention, as can be appreciated from FIG. 6, in order to improve the dicing yield, it is preferable to polish the substrate until the transmissivity is in excess of more than 60%, preferably more than 70%. The fact shown in FIG. 6 may suggest that, though the substrate being thick, high cutting yield can be obtained by using the diamond cutter even if a surface of the sapphire substrate is finished to be sufficiently smooth beforehand by removing minute cracks and the like from the surface of the sapphire substrate.

As has been stated earlier, in the GaN-based compound semiconductor blue light-emitting device according to the present invention, manufacturing process can be very simplified since polishing process can be finished in a short time. In particular, if the surface of the sapphire substrate is made optically smooth while keeping a constant thickness of the sapphire substrate not to cause an excessively thin thickness thereof, the sapphire substrate can be easily cut off into a plurality of chips. This method is suitable for mass production of the blue light-emitting device. Accordingly, according to the manufacturing method of the present invention, manufacturing yield of the GaN-based blue-green, blue, or UV light-emitting device can be improved extremely as the product.

Figure 7:
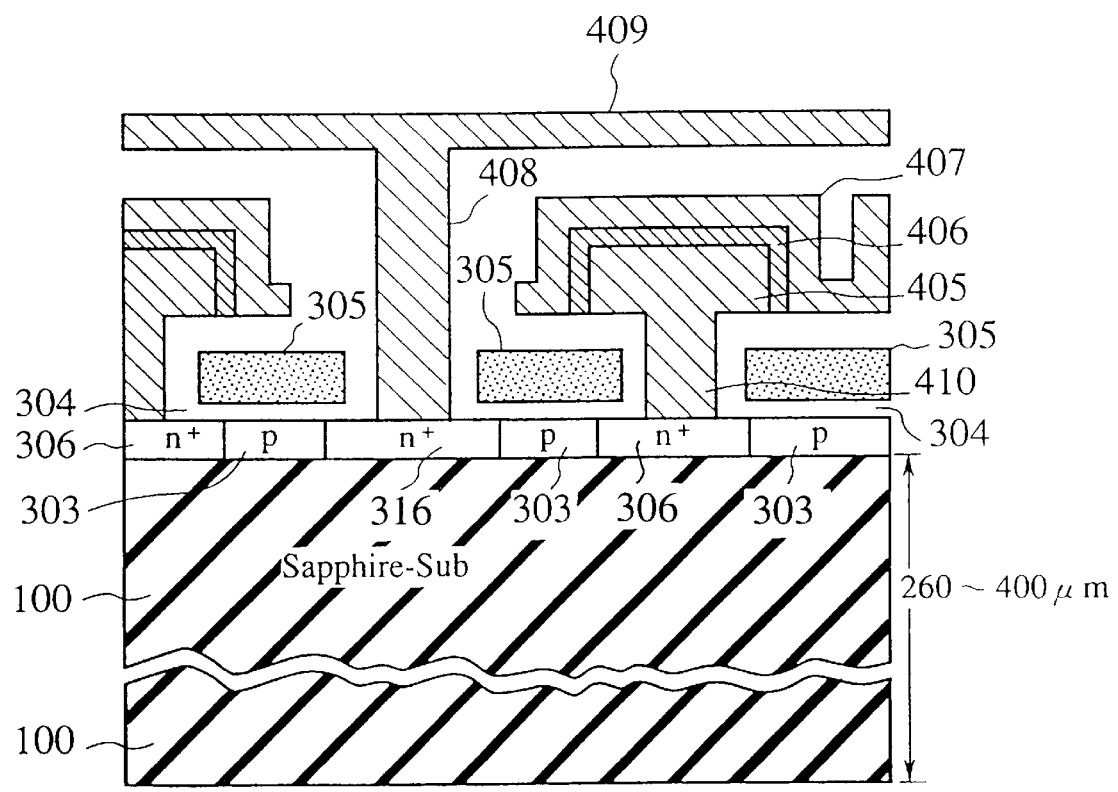
FIG. 7 is a sectional view showing a structure of an SOS-DRAM according to the present invention.

Various modifications will become possible for those skilled in the art after receiving the teachings of the present disclosure without departing from the scope thereof. In the above explanation, although the blue light-emitting diode has been explained, the present invention is applicable to any kinds of semiconductor devices in which the sapphire substrate is utilized, and also applicable to red, yellow, and infrared LED's and similar semiconductor lasers, and the semiconductor materials are not limited to GaN-based semiconductor. Namely, the present invention is not limited to these light emitting device, but it may be applied to photodetectors, high-electron-mobility transistors (HEMT's), FET's and integrated circuits such as DRAM, as shown in FIG. 7. In the DRAM of the present invention shown in FIG. 7, the silicon thin film 303 of 0.5 to 3 μm in thickness is epitaxially grown on the sapphire substrate 100 with a thickness of 260 μm to 400 μm. The $n^+$ source region 306 and the $n^+$ drain region 316 are then formed in the silicon thin film 303. A data line (bit line) 409 is then formed on the $n^+$ type drain region 316 via a contact electrode 408. A storage electrode 405, an insulating film 406, and an opposing electrode (plate electrode) 407 are then formed on the $n^+$ type source region 306 via a contact electrode 410. A gate electrode 305 formed of polysilicon, etc. is then formed on the silicon film 303 serving as a channel region between the $n^+$ type source region 306 and the $n^+$ type drain region 316 via a gate oxide film 304. The gate electrode 305 also serves as a word line of the DRAM (SOS-DRAM). If a (1012) plane is selected as the sapphire substrate, a silicon (100) plane having good crystal quality can be grown on the sapphire substrate 100. Since, in the SOS-DRAM shown in FIG. 7, surface roughness of the sapphire substrate 100 is rendered smooth not to generate unevenness of more than 30 nm in measurement by the Probe method, dicing yield of the chip by the diamond cutter can be increased extremely in the succeeding step. Accordingly, since the SOS-DRAM shown in FIG. 7 has sufficient latch-up resistance and small stray capacitance, it can operate at high speed with low power dissipation and with high radiation hardness. Since the dicing yield of the chip becomes high, the SOS-DRAM is fitted for mass production. And variety of semiconductor devices formed on the sapphire substrate can be manufactured with high yield and high productivity.

What is claimed is:

1. A semiconductor device having a layered structure comprising:

(a) a sapphire substrate having an upper surface and a lower surface, the lower surface being disposed at a bottom of the layered structure;

(b) a first conductivity type semiconductor single crystal layer formed on the upper surface of said sapphire substrate; and (c) a second conductivity type semiconductor region provided on said first conductivity type semiconductor single crystal layer;

wherein a surface roughness of the lower surface of said sapphire substrate corresponds to an unevenness of less than 10 nm as measured by a Probe method, and a thickness of the sapphire substrate is more than 260 μm.

2. A semiconductor device having a layered structure comprising:

(a) a sapphire substrate having top and bottom surfaces, the bottom surface being disposed at a bottom of the layered structure;

(b) a first cladding layer of a first conductivity type compound semiconductor formed on the top surface of said sapphire substrate;

(c) an active layer of substantially intrinsic compound semiconductor formed on said first cladding layer; and (d) a second cladding layer of a second conductivity type compound semiconductor formed on said active layer, said second conductivity type being opposite to said first conductivity type;

wherein a surface roughness of the bottom surface of said sapphire substrate corresponds to an unevenness of less than 10 nm as measured by a Probe method, and a thickness of the sapphire substrate is at least 260 μm.

3. The semiconductor device of claim 2, further comprising: a buffer layer formed of a first conductivity type compound semiconductor formed between said sapphire substrate and said first cladding layer.

4. The semiconductor device of claim 2, wherein transmissivity of said sapphire substrate is more than 60%.

5. The semiconductor device of claim 2, wherein said first cladding layer, said active layer, and said second cladding layer are formed of a III-V compound semiconductor.

6. The semiconductor device of claim 5, wherein said III-V compound semiconductor is a gallium nitride based compound semiconductor.

7. The semiconductor device of claim 6, wherein said gallium nitride based compound semiconductor is $In_xAl_yGa_{1-x-y}N$.

8. The semiconductor device of claim 7, wherein respective mole fraction values x, y in said $In_xAl_yGa_{1-x-y}N$ are selected as $0 \leq x \leq 0.3$, $0.1 \leq y \leq 1$ in said first cladding layer, $0 \leq x \leq 0.6$, $0 \leq y \leq 0.5$ in said active layer, and $0 \leq x \leq 0.3$, $0.1 \leq y \leq 1.0$ in said second cladding layer.

9. A semiconductor device having a layered structure comprising:
(a) a sapphire substrate having a top surface and a bottom surface opposite the top surface, the bottom surface being disposed at a bottom of the layered structure;
(b) a first conductivity type semiconductor single crystal layer formed on the top surface of said sapphire substrate; and
(c) second conductivity type semiconductor regions provided in said first conductivity type semiconductor single crystal layer;
wherein a surface roughness of the bottom surface of said sapphire substrate corresponds to an unevenness of less than 10 nm as measured by a Probe method, and a thickness of the sapphire substrate is more than 260 μm.

10. The semiconductor device of claim 9 wherein a plurality of said second conductivity type semiconductor regions are provided in said first conductivity type semiconductor single crystal layer.

11. The semiconductor device of claim 10, wherein said conductivity type semiconductor regions are a source region and a drain region of a MOS transistor, and a portion of said first conductivity type semiconductor single crystal layer between said source region and said drain region is a channel region of said MOS transistor.

12. A semiconductor device having a layered structure, comprising:
(a) a sapphire substrate disposed at a bottom position of the layered structure, the substrate having an upper surface and a lower surface;
(b) a first conductivity type semiconductor single crystal layer formed on the upper surface of the substrate; and
(c) a second conductivity type semiconductor region provided on the first conductivity type semiconductor single crystal layer;
wherein a surface roughness of a bottom surface of the layered structure, exposing the lower surface of the substrate, corresponds to an unevenness of less than 10 nm as measured by a Probe method, and a thickness of the substrate is more than 260 μm.

13. A semiconductor device having a layered structure, comprising:
(a) a sapphire substrate disposed at a bottom position of the layered structure, the substrate having upper and lower surfaces;
(b) a first cladding layer of a first conductivity type compound semiconductor formed on the upper surface of the substrate;
(c) an active layer of substantially intrinsic compound semiconductor formed on the first cladding layer; and
(d) a second cladding layer of a second conductivity type compound semiconductor formed on the active layer, the second conductivity type being opposite to the first conductivity type;
wherein a surface roughness of a bottom surface of the layered structure, exposing the lower surface of the substrate, corresponds to an unevenness of less than 10 nm as measured by a Probe method, and a thickness of the substrate is more than 260 μm.

14. A semiconductor device having a layered structure comprising:
(a) a sapphire substrate having an upper surface and a lower surface, the lower surface being disposed at a bottom of the layered structure to be mounted on a predetermined stem;
(b) a first conductivity type semiconductor single crystal layer formed on the upper surface of said sapphire substrate; and
(c) a second conductivity type semiconductor region provided on said first conductivity type semiconductor single crystal layer,
wherein a surface roughness of the lower surface of said sapphire substrate corresponds to an unevenness of less than 10 nm as measured by a Probe method, and a thickness of the sapphire substrate is at least 260 μm.

15. A semiconductor device having a layered structure comprising:
(a) a sapphire substrate having top and bottom surfaces, the bottom surface being disposed at a bottom of the layered structure to be mounted on a predetermined stem;
(b) a first cladding layer of a first conductivity type compound semiconductor formed on the top surface of said sapphire substrate;
(c) an active layer of substantially intrinsic compound semiconductor formed on said first cladding layer; and
(d) a second cladding layer of a second conductivity type compound semiconductor formed on said active layer, the second conductivity type being opposite to said first conductivity type,
wherein a surface roughness of the bottom surface of said sapphire substrate corresponds to an unevenness of less than 10 nm as measured by a Probe method, and a thickness of the sapphire substrate is more than 260 μm.

16. A semiconductor device having a layered structure comprising:
(a) a sapphire substrate having a top surface and a bottom surface opposite the top surface, the bottom surface being disposed at a bottom of the layered structure to be mounted on a predetermined stem;
(b) a first conductivity type semiconductor single crystal layer formed on the top surface of said sapphire substrate; and (c) a second conductivity type semiconductor region provided in said first conductivity type semiconductor single crystal layer;

wherein a surface roughness of the bottom surface of said sapphire substrate corresponds to an unevenness of less than 10 nm as measured by a Probe method, and a thickness of the sapphire substrate is more than 260 µm.

17. A semiconductor device having a layered structure comprising:

(a) a sapphire substrate disposed at a bottom position of the layered structure, the substrate having upper and lower surfaces;

(b) a first conductivity type semiconductor single crystal layer formed on the upper surface of the substrate; and (c) a second conductivity type semiconductor region provided on the first conductivity type semiconductor single crystal layer;

wherein a surface roughness of a bottom surface of the layered structure exposing the lower surface of the substrate to be mounted on a predetermined stem corresponds to an unevenness of less than 10 nm as measured by a Probe method, and a thickness of the substrate is more than 260 µm.

18. A semiconductor device having a layered structure comprising:

(a) a sapphire substrate disposed at a bottom position of the layered structure, the substrate having upper and lower surfaces;

(b) a first cladding layer of a first conductivity type compound semiconductor formed on the upper surface of the substrate;

(c) an active layer of substantially intrinsic compound semiconductor formed on the first cladding layer; and (d) a second cladding layer of a second conductivity type compound semiconductor formed on the active layer, the second conductivity type being opposite to the first conductivity type, wherein a surface roughness of a bottom surface of the layered structure exposing the lower surface of the substrate to be mounted on a predetermined stem corresponds to an unevenness of less than 10 nm as measured by a Probe method, and a thickness of the substrate is at least 260 µm.

19. A semiconductor light emitting device having a layered structure comprising:

(a) a sapphire substrate having top and bottom surfaces, the bottom surface being disposed at a bottom of the layer structure;

(b) a first cladding layer of a first conductivity type compound semiconductor formed on the top surface of said sapphire substrate;

(c) an active layer of substantially intrinsic compound semiconductor formed on said first cladding layer; and (d) a second cladding layer of a second conductivity type compound semiconductor formed on said active layer, the second conductivity type being opposite to said first conductivity type, wherein a surface roughness of the bottom surface of said sapphire substrate corresponds to an unevenness of less than 10 nm as measured by a Probe method, and a thickness of the sapphire substrate is more than 260 µm.

20. A DRAM having a memory cell structure comprising:

(a) a sapphire substrate having a top surface and a bottom surface opposite the top surface, the bottom surface being disposed at a bottom of the memory cell structure;

(b) a first conductivity type semiconductor single crystal layer formed on the top surface of said substrate;

(c) second conductivity type source and drain regions sandwiching the semiconductor single crystal layer;

(d) a word line disposed on the semiconductor single crystal layer;

(e) a capacitor comprising a storage electrode connected to the source region, an insulating film, and a plate electrode; and (f) a bit line connected to the drain region, wherein a surface roughness of the bottom surface of said sapphire substrate corresponds to an unevenness of less than 10 nm as measured by a Probe method, and a thickness of the sapphire substrate is more than 260 µm.

* * * * *